United States Patent [19]

Honda

[11] Patent Number: 5,495,529
[45] Date of Patent: Feb. 27, 1996

[54] DIGITAL SOUND LEVEL CONTROL APPARATUS

[75] Inventor: Toshio Honda, Tokyo, Japan

[73] Assignee: NEC Corporation, Japan

[21] Appl. No.: 161,928

[22] Filed: Nov. 24, 1993

[30] Foreign Application Priority Data

Nov. 26, 1992 [JP] Japan .................. 4-317030

[51] Int. Cl.$^6$ .................................. H04M 1/60
[52] U.S. Cl. .................. 379/395; 379/165; 379/93; 379/94
[58] Field of Search .................. 379/395, 394, 379/165, 93, 94, 358; 370/110.1, 84, 112, 109; 375/27, 1; 341/118; 235/152

[56] References Cited

U.S. PATENT DOCUMENTS

| | | | |
|---|---|---|---|
| 3,688,097 | 8/1972 | Montgomery | 370/119 |
| 3,752,970 | 8/1973 | Aaron et al. | 235/152 |
| 5,070,524 | 12/1991 | Mano | 379/165 |
| 5,224,159 | 6/1993 | Komuro | 379/165 |
| 5,259,001 | 11/1993 | Corceto et al. | 375/27 |
| 5,287,106 | 2/1994 | Senderowicz et al. | 341/118 |
| 5,301,205 | 4/1994 | Tsutsui et al. | 375/1 |

FOREIGN PATENT DOCUMENTS 2215944 9/1989 United Kingdom .

Primary Examiner—Jeffery A. Hofsass
Assistant Examiner—Jacques M. Saint-Surin
Attorney, Agent, or Firm—Ostrolenk, Faber, Gerb & Soffen

[57] ABSTRACT

A digital sound level control apparatus for adjusting the reception sound level from all telephone circuits to a substantially fixed level comprises a region discrimination circuit for discriminating a PCM input data signal from a PCM conversion section, including a segment coder for compressing and decompressing a digital audio signal, among an intrinsic variation signal, a basic normalization level signal and a coding threshold value, a multiplication circuit for outputting an input level signal of 12 bits, an addition circuit, a register for holding a pad multiplication value corresponding to a reception circuit, another multiplication circuit for multiplying the input level value by the pad multiplication value to output a output level signal for outputting sound by a predetermined sound level, and a comparison region discrimination circuit, a subtraction circuit, a division circuit and a register for regenerating an 8-bit digital signal from the output level signal.

6 Claims, 3 Drawing Sheets

DIGITAL SOUND LEVEL CONTROL APPARATUS

BACKGROUND OF THE INVENTION

1. Field of the Invention

This invention relates to the main unit of a key telephone system including a segment coder for companding (compressing and decompressing) a digital audio signal, and more particularly to a sound level control apparatus for use with an apparatus of the type described above.

2. Description of the Related Art

FIG. 1 shows a conventional monitor circuit of a digital audio apparatus.

Conventionally, a digital sound level control apparatus of the type mentioned above includes, as disclosed in Japanese Patent Application No. 72457/1986, entitled "Monitor Circuit" shown in FIG. 1, a circuit for adjusting the sound level output by sending a code signal to monitor body section 52 from sound level adjusting switch 54 and multiplying the PCM audio signal of the output of monitor signal extraction circuit 58 by the code signal to define the monitor sound level through sound level conversion memory 57, digital audio convertor 56 and analog amplifier 55.

The conventional digital sound level control apparatus includes a ROM in which a predetermined conversion table is stored. Accordingly, the conventional digital sound level control apparatus is disadvantageous in that much labor and time are required to write the conversion table into the ROM upon assembly of a digital key telephone system and in that, once the ROM is incorporated into a telephone apparatus, the sound level cannot be varied flexibly in conformity with the circuit with which the telephone apparatus actually is used.

SUMMARY OF THE INVENTION

The present invention provides a digital sound level control apparatus which eliminates setting of a contrast table between sound levels and conversion codes into a ROM.

According to the present invention, there is provided a first digital sound level control apparatus for a main unit of a digital key telephone system, the main unit including a circuit control section per telephone circuit, a PCM conversion section having a segment coder for compressing with the μ-Law PCM characteristic per telephone circuit, a main control section for designating pad multipliers which defines an attenuation value corresponding to the employed telephone circuit, a digital sound level control apparatus per telephone circuit and digital time switch means for switching speech paths, the digital sound level control apparatus comprising:

means for decompressing a received μ-Law digital PCM signal, means for multiplying the decompressed digital signal by said designated pad multiplier, means for compressing the multiplied value to a μ-Law PCM digital signal, and means for outputting the μ-Law digital PCM signal to the digital time switching means.

There is provided a second digital sound level control apparatus according to the present invention for the main unit of the digital key telephone system, the main unit including a circuit control section per telephone circuit, a PCM conversion section having a segment coder for compressing with the μ-Law PCM characteristic per telephone circuit, a main control section for designating pad multipliers which defines an attenuation value corresponding to the employed telephone circuit, a digital sound level control apparatus per telephone circuit and digital time switch means for switching speech paths, the digital sound level control apparatus comprising:

first discrimination means for discriminating a segment region of a μ-Law PCM conversion characteristic polygonal line from a segment region signal of a PCM input data signal which is outputted from the PCM conversion section, the PCM input data including a polarity signal, a segment region signal and a step signal;

first calculation means for calculating a first level signal which is a data value before compression using the output signal of the first segment region discrimination means and the step signal of the PCM input data signal;

multiplication means for multiplying a pad multiplier by the first level signal to output a second level signal;

second segment region discrimination means for discriminating its segment region by comparing the second level signal with the coding threshold values of segment regions based on the segment compression and decompression characteristic;

second calculation means for calculating its step signal based on the second level signal, the coding threshold signal and the intrinsic variation amount per step of the segment region;

register means for forming a μ-Law PCM digital signal combining the original polarity signal, the calculated segment region signal and the calculated step signal.

The first level signal of the digital sound level control apparatus described above may be a value obtained by adding the value which is obtained by multiplying the intrinsic variation amount per step of its segment region by the step signal to the basic normalization level signal of said segment region, or a value obtained by adding the value which is obtained by multiplying the intrinsic variation amount per step of its segment region by the step signal to the coding threshold value of said segment region.

DESCRIPTION OF THE PREFERRED EMBODIMENT

Figure 1:
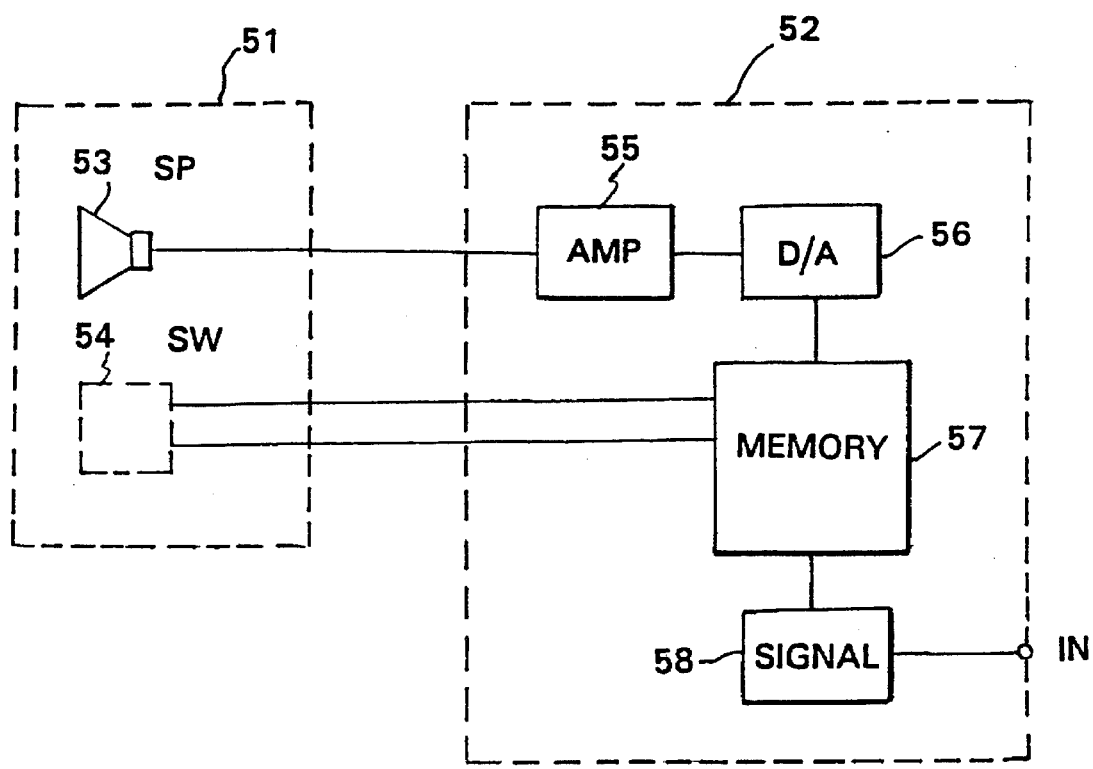
FIG. 1 is a block diagram of a monitor circuit of an example of a conventional digital sound level control apparatus.
Figure 2:
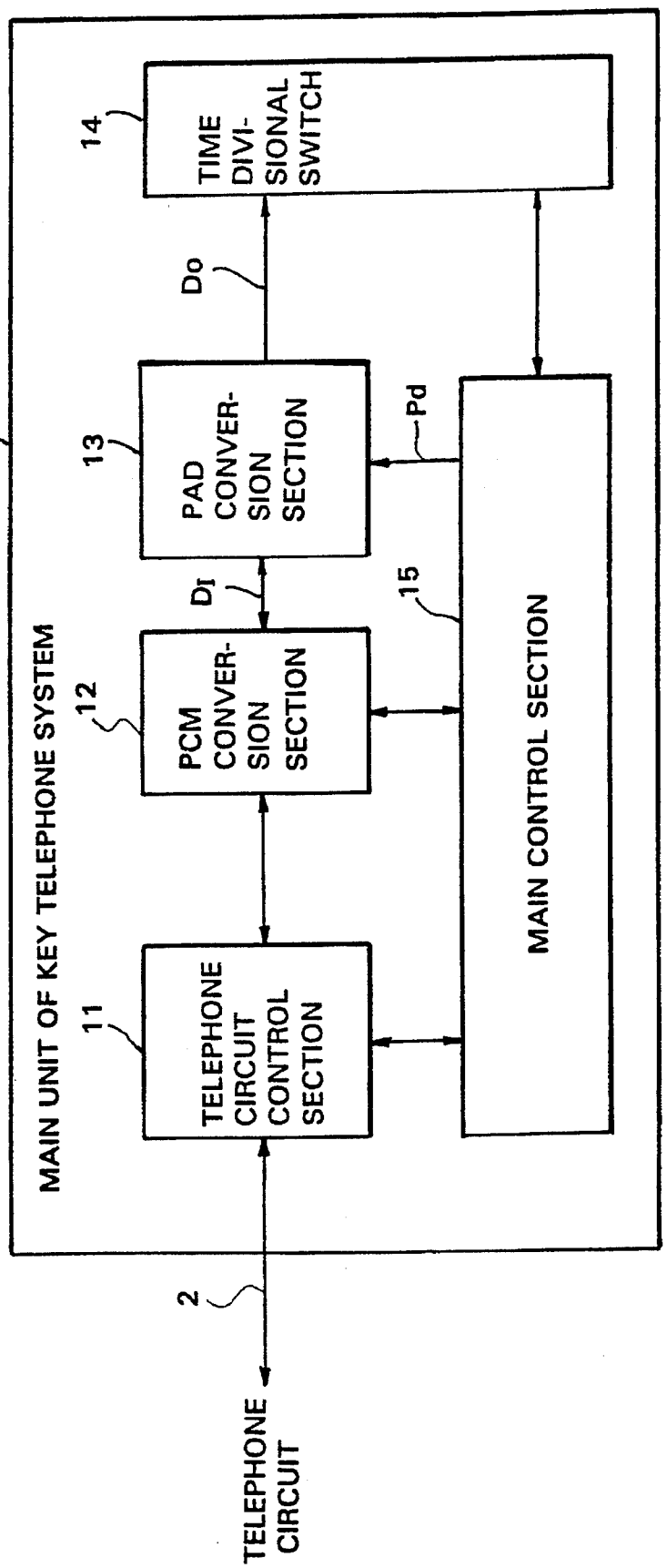
FIG. 2 is a block diagram of an embodiment of the main unit of a key telephone system.
Figure 3:
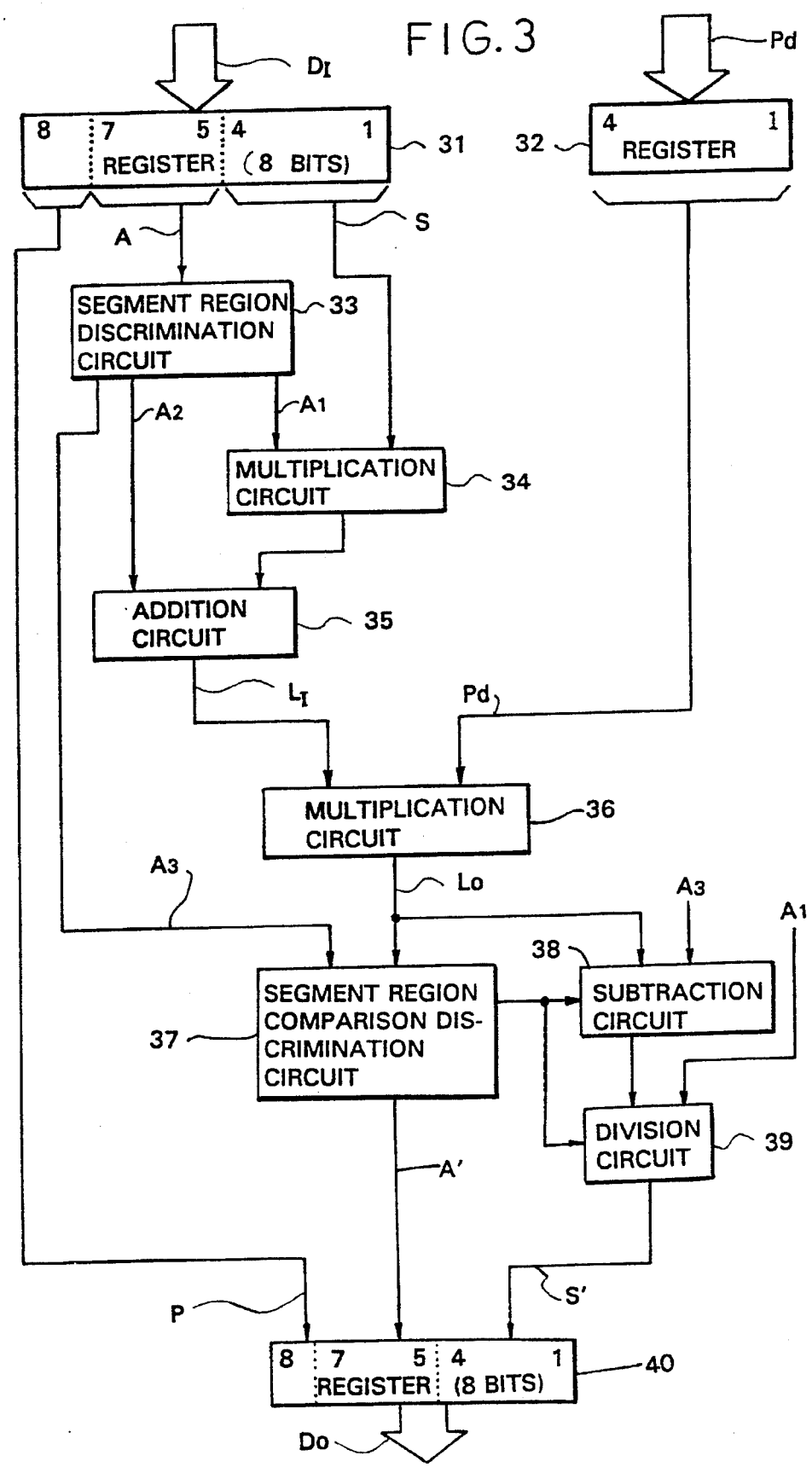
FIG. 3 is a block diagram of pad conversion section 13 shown in FIG. 2.

An embodiment of the present invention is described with reference to FIGS. 2 and 3.

The main unit of key telephone system 1 comprises circuit control section 11, PCM conversion section 12, main control section 15, pad conversion section 13 and time divisional switch 14.

The present invention is incorporated in pad conversion section 13 and main control section 15.

Circuit control section 11 serves as an interface to telephone circuit 2 and reports to main control section 15 the classification of telephone circuits employed for incoming telephone calls. PCM conversion section 12 converts an incoming analog data signal into a μ-Law PCM digital signal. Pad conversion section 13 outputs data signal $D_O$ which is modified from PCM input data signal $D_I$ from PCM conversion section 12 to digital data having a controlled sound level by decompressing, multiplying by pad multiplier $P_d$ sent from main control section 15 and compressing to μ-Law PCM digital data. Main control section 15 outputs multiplier $P_d$ signal to pad conversion section 13 corresponding to the employed incoming telephone circuit by discriminating by notification from circuit control section 11. Time division switch 14 switches telephone calls by switching the connection of the PCM highway.

PCM input data signal $D_I$ is an 8-bit signal wherein the MSB of the eighth bit serves as polarity signal P, the three bits of the seventh to fifth bits serve as a segment region (described as region signal A hereafter) which identifies a segment, and the remaining four bits of the fourth to first bits serve as step signal bits S representative of a position in a segment.

Region signal A includes intrinsic variation signal $A_1$ representative of the variation amount per step of the level value in the segment region before compression, basic normalization level signal $A_2$ (4,191 in region 8; 2,079 in region 7; 1,023 in region 6 and the like) representative of a reference point for each segment region before compression, and coding threshold value $A_3$ (4,063 in region 8; 2,015 in region 7; 991 in region 6 and the like) representative of the start point of each region before compression.

Pad conversion section 13 converts compressed PCM input data into data of the level before compression with reference to the basic normalization level signal before compression, multiplies the data of the converted or decompressed level by a pad multiplier to convert the data into a predetermined sound volume, compresses the volume signal again, and outputs the thus-compressed volume signal to the time division switch. Pad conversion section 13 includes register 31 for temporarily storing input data signal Di, another register 32 for temporarily storing a pad multiplier signal, region discrimination circuit 33 for discriminating region signal A in PCM input data signal $D_I$ and dividing region signal A into intrinsic variation signal $A_1$, normalization reference level signal $A_2$ and coding threshold value $A_3$, multiplication circuit 34 for multiplying step signal S in PCM input data $D_I$ by intrinsic variation amount signal $A_1$, addition circuit 35 for adding basic normalization level signal $A_2$ to the output signal of multiplication circuit 34 to output input level signal $L_I$, another multiplication circuit 36 for multiplying input level signal $L_I$ by pad multiplier signal $P_d$ to output output level signal $L_O$, comparison region discrimination circuit 37 for comparing output level signal $L_O$ and coding threshold value $A_3$ to determine to which region output level signal $L_O$ corresponds, and outputting region signal A' based on the determination, subtraction circuit 38 for subtracting coding threshold value $A_3$ of the region from output level signal $L_O$, division circuit 39 for dividing the output of subtraction circuit 38 by intrinsic variation signal $A_1$ to output step signal S', and register 40 for temporarily storing polarity signal P, region signal A' and step signal S'.

Operation of the present embodiment is described below.

Analog audio data received from telephone circuit 2 are inputted by way of circuit control section 11 and converted into a PCM signal by PCM conversion section 12. In this instance, circuit control section 11 determines whether the received call is originated from an extension line or another subscriber line and notifies the result of the determination to main control section 15.

Meanwhile, PCM input data signal $D_I$ as audio data coded by PCM coding by PCM conversion section 12 is outputted to pad conversion section 13. Separately, depending on the result of the determination of either an extension line or another subscriber line previously notified to main control section 15, pad multiplication value signal $P_d$ representative of an attenuation amount is instructed from main control section 15 to pad conversion section 13, and PCM output data signal $D_O$ for which the sound volume difference has been adjusted is outputted to time division switch section 14 in which a PCM highway is exchangeably connected.

Here, the sound level difference among calls from extension lines and other subscriber lines can be eliminated, by the way that multipliers to designate attenuation amounts are set and stored in main control section 15 in such a manner that the attenuation amount is 0 dB for a call received from outside line 2 but is 6 dB for a call received from an extension line.

Next, operation of pad conversion section 13 of the present embodiment is described.

PCM input data signal $D_I$ from PCM conversion section 12 is inputted to 8-bit register 31 while pad multipier value signal $P_d$ for determination of the attenuation amount from main control section 15 is inputted to 4-bit register 32.

Region discrimination circuit 33 discriminates a region from region signal A in PCM input data signal $D_I$ inputted to register 31 and outputs basic normalization level signal $A_2$ intrinsic to the region, intrinsic variation amount signal $A_1$ intrinsic to the region determined from region signal A, and coding threshold value $A_3$.

Multiplication circuit 34 multiplies intrinsic variation value signal $A_1$ by step signal (bits 4 to 1) S of PCM input signal $D_I$, and the result of the addition of the result of the multiplication to basic normalization signal $A_2$ by addition circuit 35 is outputted as input level signal $L_I$. Meanwhile, polarity signal (bit 8) P of PCM input data signal $D_I$ is not inputted to region discrimination circuit 33 but is outputted as is as a polarity signal of PCM output data signal $D_O$.

The pad multiplication value signal instructed from main control section 15 is inputted to and then outputted from register 32.

Multiplication circuit 36 multiplies input level signal $L_I$ outputted from addition circuit 35 by pad multiplication value signal $P_d$ outputted from register 32 and outputs the result of the multiplication as output level $L_O$.

Segment region comparison discrimination circuit 37, which compares coding threshold value $A_3$ determined from region signal A by region discrimination circuit 33 and output level signal $L_O$ outputted from multiplication circuit 36, determines the region to 10 which output level signal $L_O$ corresponds, and outputs corresponding region signal (bits 7 to 5) A'.

Further, the result of subtraction of coding threshold value $A_3$ from output level signal $L_O$ by subtraction circuit 38 is divided by intrinsic variation signal $A_1$ determined from region signal A' by division circuit 39, and the result of the division is outputted as step signal (bits 4 to 1) S'.

PCM output data signal $D_O$, after conversion into a pad value instructed by main control section 15 from polarity signal (bit 8) P, region signal (bits 7 to 5) A' and step signal (bits 4 to 1) S' is stored once into and then outputted from register 40.

Meanwhile, main control section 15 outputs pad multiplication value $P_d$ to pad conversion section 13 in accordance with the type of circuit. Where the number of types of circuits involved is great, it may be possible to provide means for setting correspondence tables so that the corresponding pad multiplier may be outputted for each of the types of circuits.

Further, while, in the present embodiment, input level $L_I$ is obtained by the addition of the product between intrinsic variation signal $A_1$ and step signal S to the normalization reference level signal, it may be obtained otherwise by the addition of the product between intrinsic variation $A_1$ and step number S to coding threshold value $A_3$.

As described to this point, according to the present invention, since a region signal and a step signal corresponding to a circuit from which a call is received, not a fixed region signal or a step signal (as is outputted from a conventional digital sound level control apparatus), are outputted from the digital sound level control apparatus of the present invention by calculating the region signal, and the step signal there is an advantage in that the reception sound level can be held substantially constant irrespective of from which telephone circuit a call is received. Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A digital sound level control apparatus for a main unit of a digital key telephone system for receiving signals from a plurality of telephone circuits, said telephone circuits each having a classification, said main unit including a circuit control section per telephone circuit for determining the classification of an employed one of the plurality of telephone circuits, a PCM conversion section having a segment coder for compressing with the µ-Law PCM characteristic per telephone circuit, a main control section for designating a pad multiplier which defines an attenuation value corresponding to the determined classification of said employed telephone circuit, a digital sound level control apparatus per telephone circuit, and digital time switch means for switching speech paths, said digital sound level control apparatus comprising:

means for decompressing a µ-Law digital PCM signal received from said PCM conversion section, means for multiplying said decompressed digital signal by said designated pad multiplier received from said main control section which defines said attenuation value corresponding to said determined classification of said employed telephone circuit, means for compressing said multiplied value to a µ-Law PCM digital signal, and means for outputting said µ-Law digital PCM signal to said digital time switching means.

2. A digital sound level control apparatus for a main unit of a digital key telephone system for receiving signals grow a plurality of telephone circuits, each of said telephone circuits having a classification, said main unit including a circuit control section per telephone circuit for. determining the classification of an employed one of the plurality of telephone circuits, a PCM conversion section having a segment coder for compressing with the µ-Law PCM characteristic per telephone circuit, a main control section for designating a pad multiplier which defines an attenuation value corresponding to the determined classification of said employed telephone circuit, a digital sound level control apparatus per telephone circuits and digital time switch means for switching speech paths, said digital sound level control apparatus comprising:

first discrimination means for discriminating a segment region of a µ-Law PCM conversion characteristic polygonal line from a segment region signal of a PCM input data signal which is outputted from said PCM conversion section, said PCM input data including a polarity signal, a segment region signal and a step signal;

first calculation means for calculating a first level signal which is a data value before compression using an output signal of said first segment region discrimination means and the step signal of the PCM input data signal;

multiplication means for multiplying said pad multiplier received from said main control section which defines said attenuation value corresponding to said classification of said employed telephone circuit by said first level signal to output a second level signal;

second segment region discrimination means for discriminating a segment region of said second level signal by comparing the second level signal with the coding threshold values of segment regions based on the segment compression and decompression characteristic;

second calculation means for calculating a step signal of said second level signal based on said second level signal, the coding threshold signal and intrinsic variation amount per step of the segment region of said second level signal; and register means for forming a µ-Law PCM digital signal combining the original polarity signal, the calculated segment region signal, and the calculated step signal.

3. A digital sound level control apparatus as claimed in claim 2, wherein the first level signal is the value obtained by adding a value which is obtained by multiplying the intrinsic variation amount per step of said first segment region by the step signal to the basic normalization level signal of said first segment region.

4. A digital sound level control apparatus as claimed in claim 2, wherein the first level signal is the value obtained by adding a value which is obtained by multiplying the intrinsic variation amount per step of said first segment region by the step signal to the coding threshold value of said first segment region.

5. A digital sound level control apparatus for a digital key telephone system for receiving signals from a plurality of telephone circuits, each of said telephone circuits having a classification, said apparatus comprising:

means for decompressing a µ-Law PCM compressed digital signal received from a PCM conversion means to generate a decompressed digital signal, means for multiplying said decompressed digital signal by a multiplier received from said main control section, said multiplier corresponding to said classification of an employed one of said plurality of telephone circuits, means for compressing said multiplied decompressed digital signal to generate a multiplied µ-Law PCM digital signal, and means for outputting said multiplied µ-Law digital PCM signal to a digital time switching means.

6. A method for digitally controlling a sound level for a digital key telephone system for accessing a plurality of telephone circuits, each of said telephone circuits having a classification, said method comprising the steps of;

decompressing a µ-Law PCM compressed digital signal to generate a decompressed digital signal, determining said classification of an employed one of said plurality of telephone lines;

multiplying said decompressed digital signal by a multiplier, said multiplier corresponding to said classification of said employed one of said plurality of telephone circuits, compressing said multiplied decompressed digital signal to generate a multiplied µ-Law PCM digital signal, and outputting said multiplied µ-Law digital PCM signal to a digital time switching means.

* * * * *